United States Patent [19]
So et al.

[11] Patent Number: 5,895,951
[45] Date of Patent: Apr. 20, 1999

US005895951A

[54] MOSFET STRUCTURE AND FABRICATION PROCESS IMPLEMENTED BY FORMING DEEP AND NARROW DOPING REGIONS THROUGH DOPING TRENCHES

[75] Inventors: Koon Chong So, Santa Clara; Yan Man Tsui, Union City; Fwu-Iuan Hshieh, Saratoga; True-Lon Lin, Cupertino; Danny Chi Nim, San Jose, all of Calif.

[73] Assignee: MegaMOS Corporation, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/628,493

[22] Filed: Apr. 5, 1996

[51] Int. Cl.$^6$ ............ H01L 29/76; H01L 29/94; H01L 31/062; H01L 31/113
[52] U.S. Cl. ............ 257/330; 257/329; 257/331; 257/339; 257/341; 257/342
[58] Field of Search ............ 257/329, 330, 257/331, 339, 341, 342

[56] References Cited

U.S. PATENT DOCUMENTS

| | | | |
|---|---|---|---|
| 4,567,641 | 2/1986 | Baliga et al. | 257/331 |
| 4,960,723 | 10/1990 | Davies | 257/329 |
| 5,648,670 | 7/1997 | Blanchard | 257/329 |

*Primary Examiner*—Steven H. Loke
*Attorney, Agent, or Firm*—Bo-In Lin

[57] ABSTRACT

This invention discloses a MOSFET device which includes a plurality of vertical cells each includes a source, a drain, and a channel for conducting source-to-drain current therethrough. Each of the vertical cells is surrounded by a polysilicon layer acting as a gate for controlling the source-to-drain current through the channel. The MOSFET device further include a plurality of doping trenches filled with trench-filling materials. The MOSFET device further includes a plurality of deep-doped regions disposed underneath the doping trenches wherein the deep-doped region extends downwardly to a depth which is substantially a sum of an implant depth of the deep-doped region and a vertical diffusion depth below a bottom of the doping trenches.

11 Claims, 14 Drawing Sheets

MOSFET STRUCTURE AND FABRICATION PROCESS IMPLEMENTED BY FORMING DEEP AND NARROW DOPING REGIONS THROUGH DOPING TRENCHES

BACKGROUND OF THE INVENTION

1. Field of the Invention

This invention relates generally to the structure and fabrication process of MOSFET transistors. More particularly, this invention relates to a novel and improved MOSFET structure and fabrication process implemented by forming deep and narrow doping regions through doping trenches.

2. Description of the Prior Art

Figure 1A:
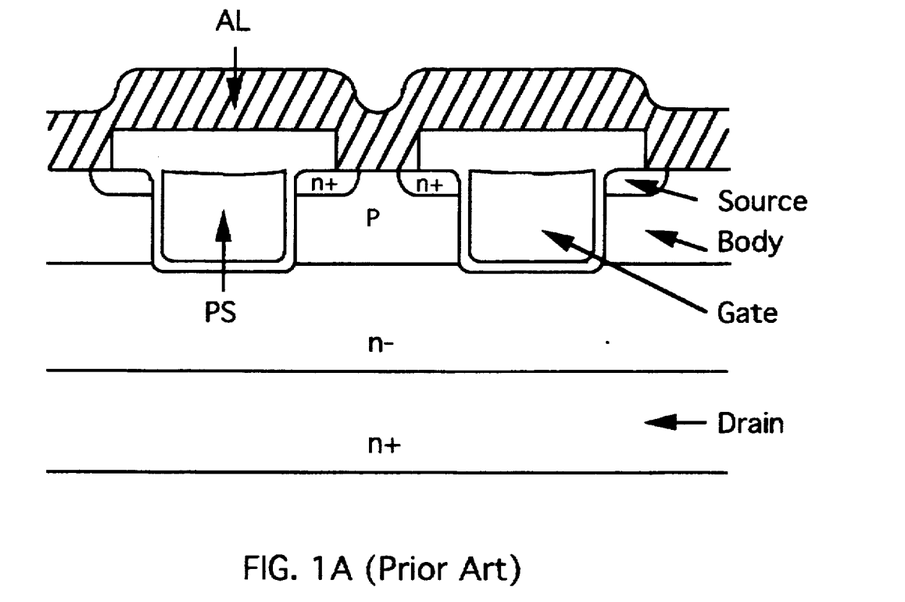
FIGS. 1A to 1C are cross-sectional views of prior art MOSFET transistors showing the requirement of a deep-P region underneath the source regions.
Figure 1B:
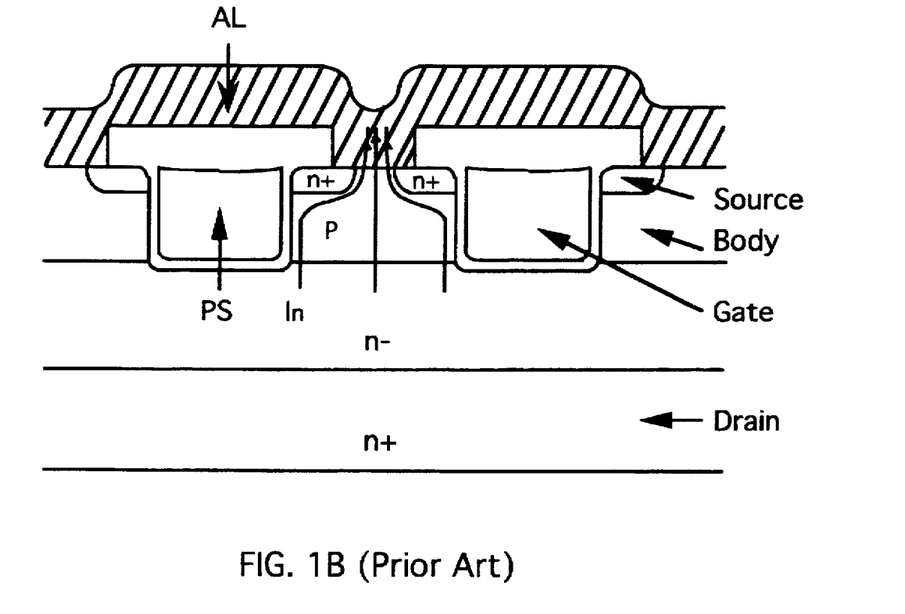
Figure 1C:
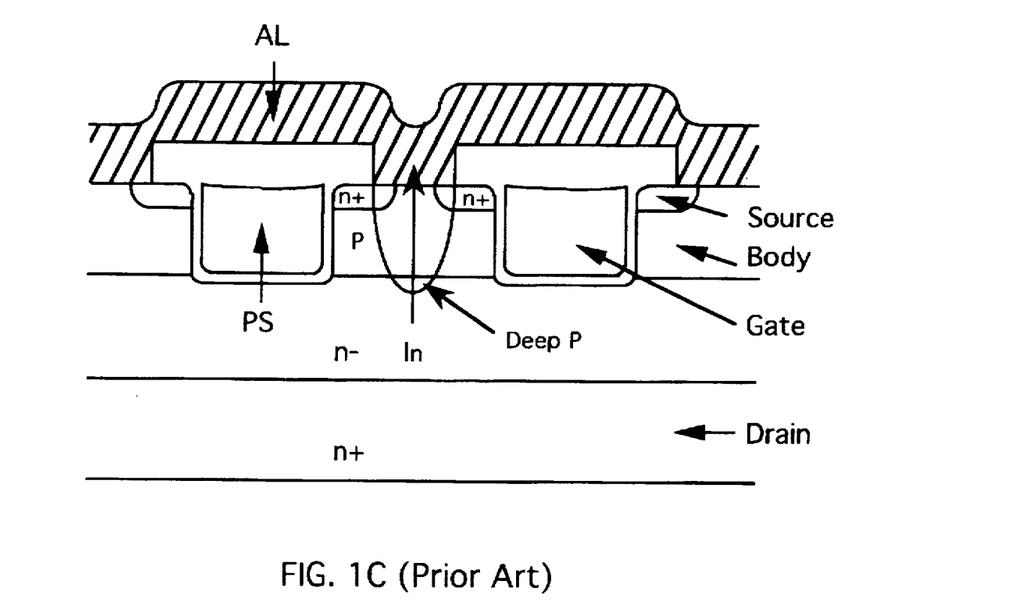

In a conventional vertical power MOSFET fabrication process, the requirement to form a high concentration p-region with sufficient depth below the $n^+$ source region in order to prevent an avalanche breakdown to occur at the junction directly underneath the $n^+$ source region generates an intrinsic limitation in shrinking the cell size. This limitation can be well appreciated by referring to a standard trenched MOSFET transistor as that shown in FIG. 1A. This trenched power MOSFET has a built-in parasitic bipolar structure with the P-body, $N^+$ source and drain regions formed as a base, emitter and collector respectively of the parasitic bipolar. During an avalanche breakdown, due to a high current and voltage of the MOSFET, the bipolar may be incidentally turned on. As an undesirable consequence of this incidental turning on of the parasitic bipolar, the drain voltage of the MOSFET may "snap back" to or below the open-base breakdown voltage of the bipolar transistor. Due to the incidental turning on of the bipolar, as that shown in FIG. 1B, a hole-current during avalanche flows laterally underneath the $n^+$ source region which may cause permanent damages to the transistor. Therefore, an incidental turning on of the parasitic bipolar must be suppressed and the hole-current laterally flows underneath the $n^+$ source region must be re-directed to protect the MOSFET under high current and high voltage conditions. A method to protect a MOSFET transistor from this type of damages is to form a high concentration deep-P region, e.g., a p-short region, below the $n^+$ source region as that shown in FIG. 1C. The deep-P region serves to reduce the current gain of the parasitic bipolar and also provides a vertical path for the hole-current to flow to the source metal contact.

A high concentration deep-P region formed with greater depth under the source region imposes several restrictions on the structure and manufacture process of a MOSFET device due to a relative large depth and lateral diffusion of the deep-P region. First, an alignment step and long diffusion thermal cycle are required to form the deep-P region at the center of the cell as that shown in FIG. 1C. The requirements of alignment and the longer thermal cycles in forming the deep-P region increase the complexity and costs of the MOSFET manufacture. Secondly, the cell size cannot be easily reduced due to the lateral diffusion of the deep-P region when this region is formed with greater depth.

Therefore, there is still a need in the art of transistor fabrication, particularly in MOSFET design and fabrication, to provide a structure and fabrication process that would remove these limitations with improved device structure and fabrication processes.

SUMMARY OF THE PRESENT INVENTION

It is therefore an object of the present invention to provide a new MOSFET structure and fabrication process to enable those of ordinary skill in the art of MOSFET fabrication to overcome the aforementioned difficulties and limitations as encountered in the prior art.

Specifically, it is an object of the present invention to provide an improved MOSFET structure and fabrication process wherein the process of forming a deep-P regions for suppressing incidental turning-on of a parasitic bipolar can be accomplished with the deep-P regions formed with sufficient depth without proportional lateral diffusion whereby the cell size can be reduced without being limited by the lateral diffusion length of the deep-P regions.

Another object of the present invention is to provide an improved MOSFET fabrication process wherein the process of forming a deep-P region for suppressing incidental turning-on of a parasitic bipolar can be accomplished with a self-aligned process such that the manufacturability of the MOSFET devices can be improved.

Another object of the present invention is to provide an improved MOSFET fabrication process wherein the process of forming a deep-P region for suppressing incidental turning-on of a parasitic bipolar can be accomplished by implanting and diffusing a deep-P region through the trenches which are opened at the locations where the deep-P regions are assigned to be located thus this fabrication process can be employed for trenched, planar power MOSFET, IGBT, MCT and other devices and for both N-type and P-type transistors.

Another object of the present invention is to provide an improved MOSFET fabrication process wherein the process of forming a deep-P region for suppressing incidental turning-on of a parasitic bipolar can be accomplished by implanting and diffusing the deep-P regions through the trenches which are opened at the locations where the deep-P regions are assigned to be located such that the width, depth, locations and shapes of the deep-P regions can be flexibly designed and manufactured.

Briefly, in a preferred embodiment, the present invention includes a MOSFET fabrication process for fabricating a MOSFET transistor on a substrate. The fabrication process includes the steps of (a) etching a doping trench in the substrate above a region for the deep-doping region; and (b) introducing dopants through the doping trench to form the deep-doping region.

The present invention also discloses a MOSFET vertical cell which includes a source, a drain, and a channel for conducting source-to-drain current therethrough. The vertical cell is surrounded by a poly layer acting as a gate for controlling the source-to-drain current through the channel. The MOSFET cell further includes a doping trench filled with trench-filling materials. The MOSFET vertical cell further includes a deep-doping region disposed underneath the doping trench. In a preferred embodiment, the doping trench disposed at the center of the vertical cell with the deep-doping region disposed underneath a center portion below the vertical cell. In another preferred embodiment, the doping trench disposed under the poly layer with the deep-doping region disposed underneath the gate.

These and other objects and advantages of the present invention will no doubt become obvious to those of ordinary skill in the art after having read the following detailed description of the preferred embodiment which is illustrated in the various drawing figures.

3

DETAILED DESCRIPTION OF THE PREFERRED EMBODIMENT

Figure 2:
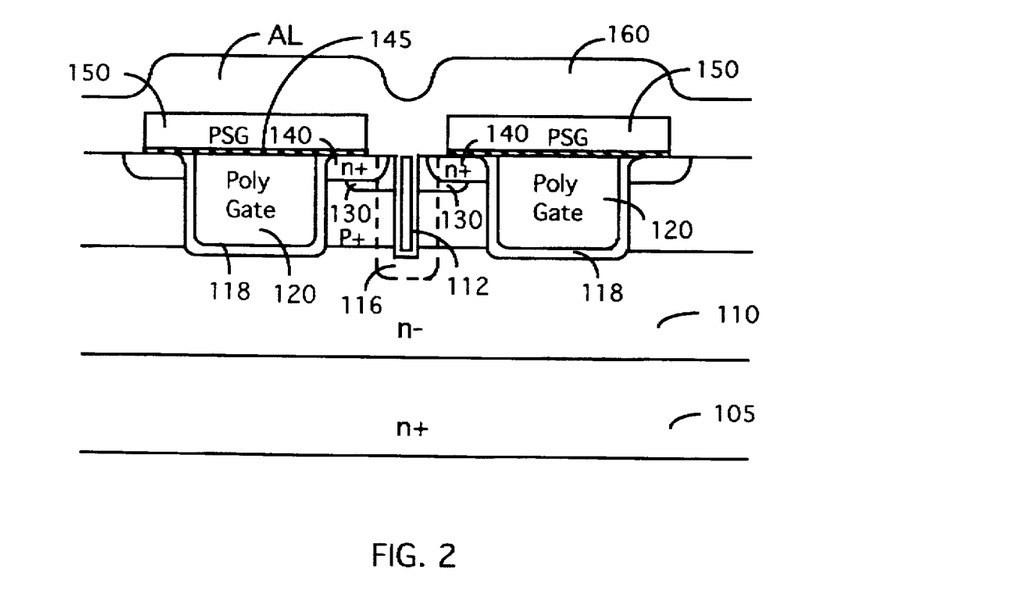
FIG. 2 is a cross sectional view to show the structure of a MOSFET transistor with a deep and narrow deep-P regions formed through an doping trenches of the present invention.

A novel MOSFET fabrication process is disclosed in this invention wherein a self-aligned method is applied to form a deep-P region for suppressing incidental turning-on of a parasitic bipolar transistor. This deep-P region can be formed with greater depth without causing proportional lateral diffusion by implanting and diffusing this deep-P region through doping-trenches which are opened at the locations where the deep-P regions are assigned to be located thus enabling a reduction of cell-size and increase the cell density for a MOSFET power device. This innovative device structure and process can be modified to apply to different devices or processing requirements to make trench or planar MOSFET or other types of devices when deep and narrow implant and diffusion regions are required while the lateral diffusion of such deep implanted regions may cause limitations or difficulties. FIG. 2 shows the cross section of such a device 100 with detail processing steps described below.

Figure 3A:
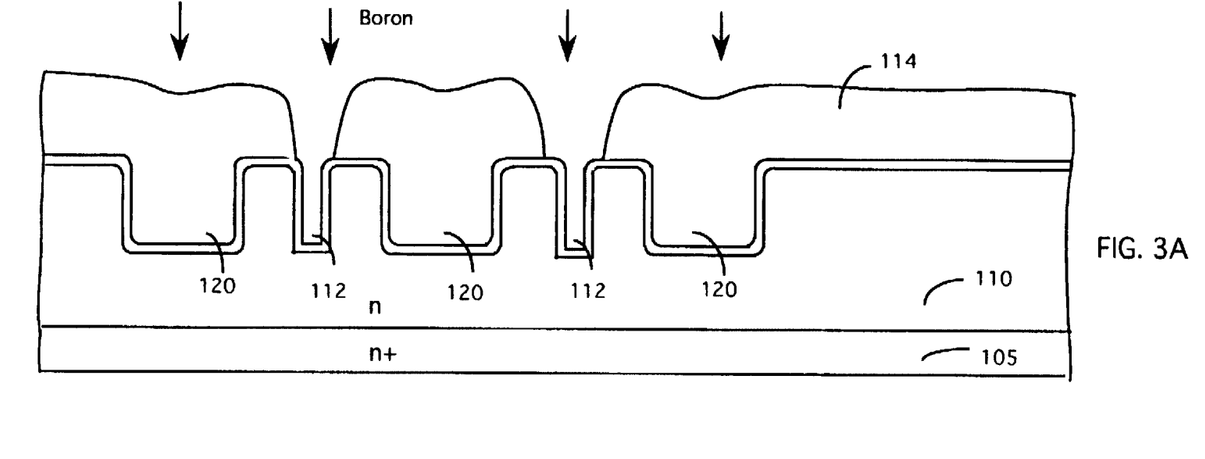
FIGS. 3A to 3G are cross sectional views showing the processing steps of a MOSFET transistor of FIG. 2.

Please refer to FIGS. 3A to 3H for the processing steps in manufacturing the MOSFET device 100. As shown in FIG. 3A, the processing steps begins by first growing a N⁻ epitaxial layer 110 with a resistivity ranging from 0.1 to 10 ohm-cm on top of a N⁺ substrate 105. The substrate has a resistivity of 0.001 to 0.07 ohm-cm. The thickness and the resistivity of the epitaxial layer 110 depend on the device requirements for the on-resistance and breakdown voltage. In a preferred embodiment, the thickness of the epi-layer 110 ranging from about three to twenty microns and has a resistivity of 0.1 to 2.0 ohm-cm. A photoresist is employed as a trench mask to carry out a trench etch process, which is a dry anisotropic etch process, is applied to form trenches of 1.0 to 2.0 microns in width and 1.0 to 2.0 micron in depth. A sacrification oxidation process is applied which can be either a dry or wet oxidation process conducted at a temperature of 900–1100° C. to form oxide layer of approximately 300–2000 Å in thickness which is followed by a sacrification oxide etch process. In addition to the trenches formed for gate deposition with polysilicon to be described below, additional doping-trenches 112 for deep-P implant are also etched. A photoresist 114 is applied as a deep-P mask to carry out a deep-P implant with boron ions of energy ranging from 10 to 100 Kev and the boron ion flux ranging from $2 \times 10^{13}$ to $10^{15}/cm^2$. The photoresist 114 applied as deep-P mask is removed followed by an oxidation process. A thermal process is performed to anneal the implant defect and to drive-in the implant atoms into a specific depth to form the deep-P regions 116.

Figure 3B:
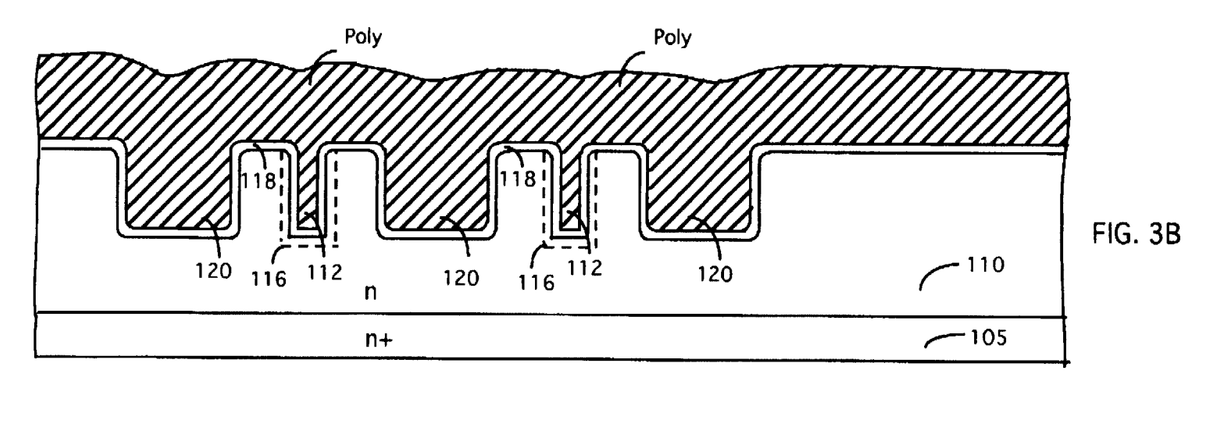
Figure 3C:
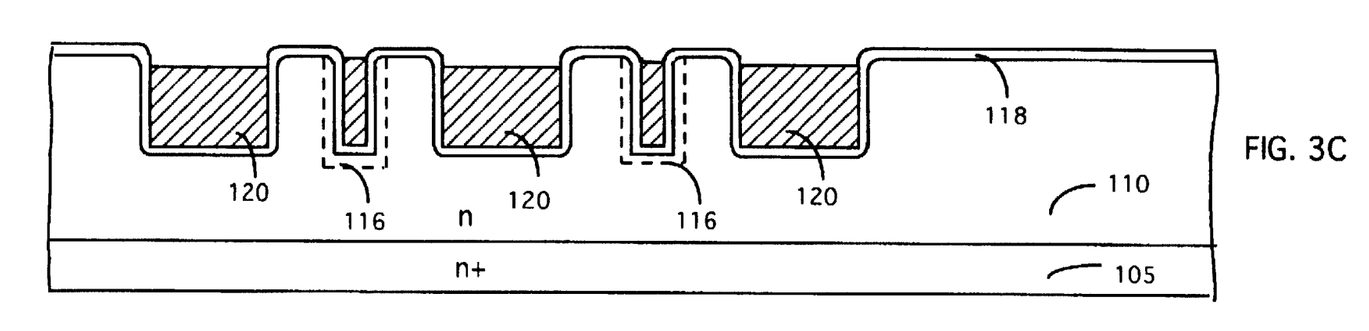

Please refer to FIG. 3B, a sacrification oxidation process is applied which can be either a dry or wet oxidation process conducted at a temperature of 900–1100° C. to form an oxide layer (not shown) of approximately 300–2000 Å in thickness which is followed by a sacrification oxide etch process to smooth the bottom surfaces and corners of the trenches and to remove the damaged surface areas of the trenches caused by reactive ion etch (RIE). A gate oxide layer 118 is then formed by a gate oxidation process which can be a wet or dry oxidation process carried out at a temperature of 800 to 1100° C. to form a layer of thickness in the range of 300 to 1,000 Å. A polysilicon deposition process is performed to deposit a polysilicon layer 120 ranging from 1.5 to 3.0μ in thickness. A planarization etch is performed on the ploy layer 120 by etching a top layer to 0.2–0.4μ from the deposited poly. A POCL₃ doping process is carried out at 950° C. to make the poly layer 120 have a sheet resistance of 20–40 ohm/cm². Referring to FIG. 3C, where a poly etch is carried out to dry etch the poly layer 120 till the top surface is removed. The poly etch is performed with the end-point detection to terminate the etch process when the polysilicon layer 120 above the trench is removed.

Figure 3D:
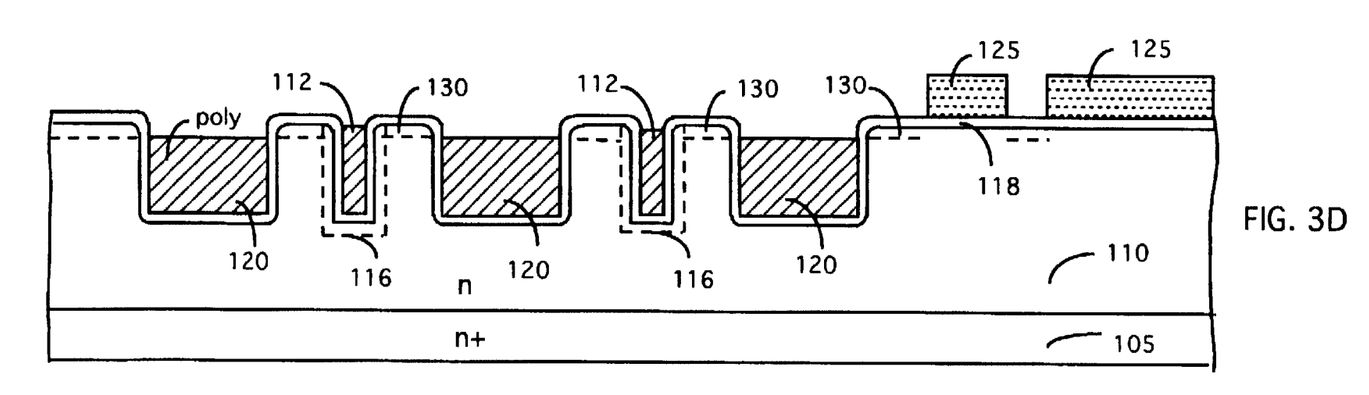

Referring to FIG. 3D, where a p-body implant with boron ions at 30–100 Kev with an ion beam of $2 \times 10^{13}$ to $2 \times 10^{14}/cm^2$ flux density is performed with a P-body mask 125 to form the p-body region 130. The P-body mask 125, e.g., the photoresist, is then removed.

Figure 3E:
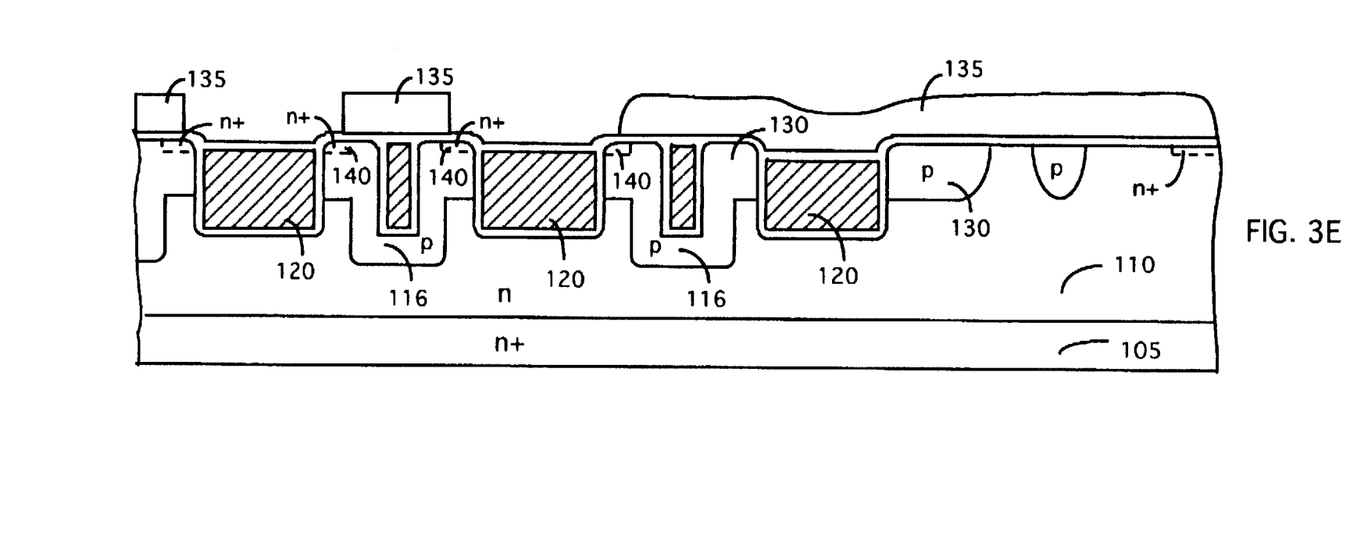

Referring to FIG. 3E, a p-body diffusion process is carried out at an elevated temperature of 1,000–1,200° C. for ten minutes to three hours to increase the depth of the p-body region 130 to 1.0–2.0μ. With the N⁺ source blocking mask 135, the N⁺ implantation is carried out with an arsenic or phosphorus ion beam at an energy of 50–100 Kev and ion flux density of $5 \times 10^{15}$ to $1 \times 10^{16}/cm^2$ to form the N⁺ region 140. The N⁺ blocking mask 135 is striped and the N⁺ source regions 140 are driven into desired junction depth ranging from 0.2 to 1.0μ by a diffusion process at a temperature of 900–1000° C. for 10 minutes to two hours.

Figure 3F:
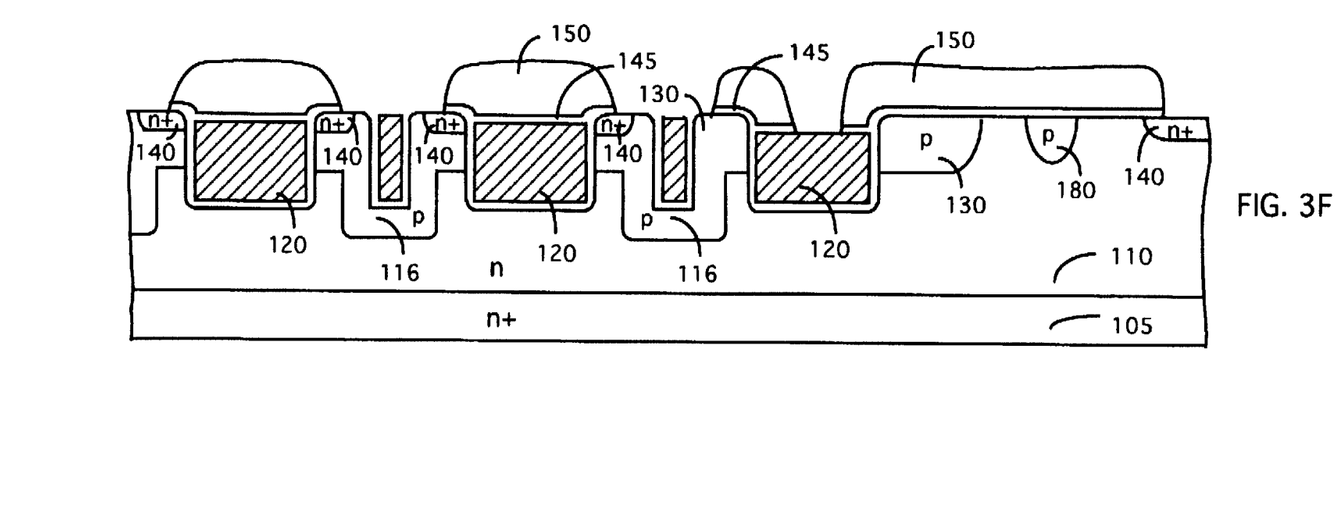
Figure 3G:
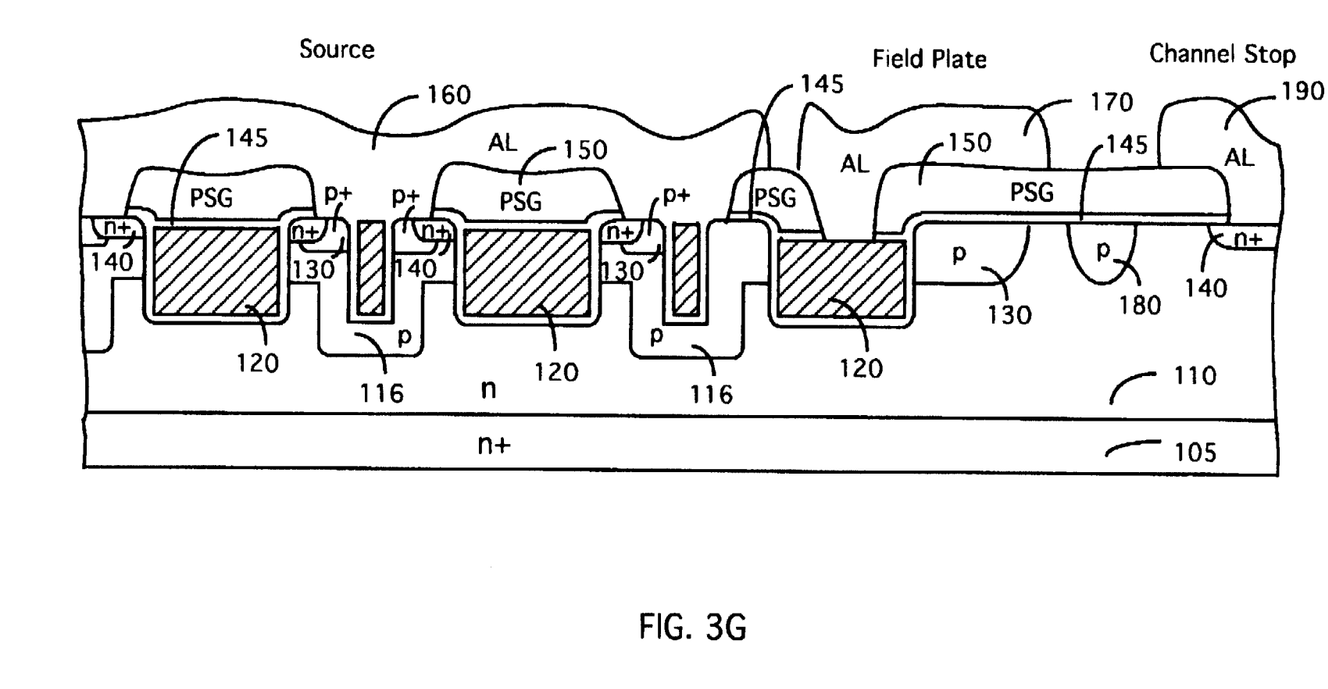

Referring to FIG. 3F, a low pressure chemical vapor deposition (LPCVD) nitride layer 145 is formed over the top surface. This LPCVD nitride layer provides a special advantage that cost savings are achieved because of the requirement for a passivation layer to protect the MOSFET transistor from free-ions is eliminated. A BPSG or PSG is deposited to form a layer 150 of approximately 5000–15,000 Å in thickness. A BPSG flow or PSG densification process is performed at 900–950° C. for thirty minutes to one hour. A contact mask, is applied to perform an etching process through the PSG or BPSG layer 150 and the nitride layer 145 to define the contact windows. The final power MOSFET device 100, as shown in FIG. 3G, is completed with the metal deposition and metal etching with a metal mask to define the source contacts 160, the gate contacts (not shown), the field plate 170, equal potential ring 180, and the channel stop 190.

Referring back to FIG. 2, a deep and narrow P region 116 is formed by making use of a doping-trench 112. These deep-P regions 116 are formed without greater width due to lateral diffusion. By applying the processing steps of this invention, cell size reduction is achievable without being limited by the width of these deep-P regions. The deep-P regions 116 formed by performing a boron implant into the deep-P doping trenches 112 are also a procedure which is self aligned. Precise disposition of the deep-P regions are feasible. This self-alignment feature improves the MOSFET manufacturability and meanwhile further enhances the feasibility of cell-size reduction.

Figure 4A:
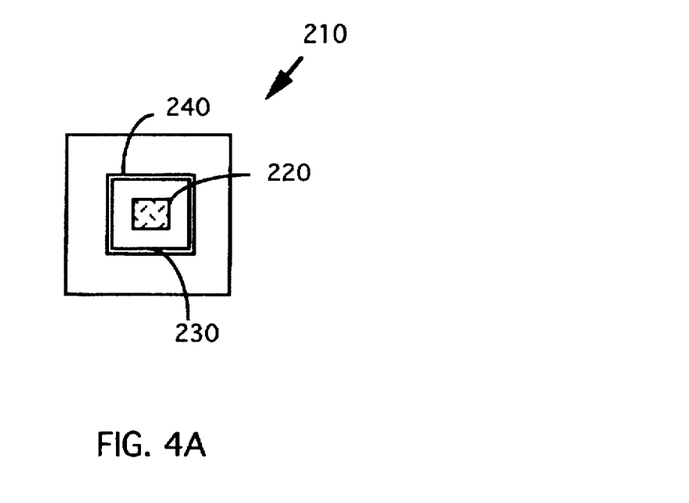
FIGS. 4A to 4C show, the top and cross-sectional views MOSFET transistors of the present invention where the doping trenches are shaped as plugs and disposed in the center of the active cells.
Figure 4B:
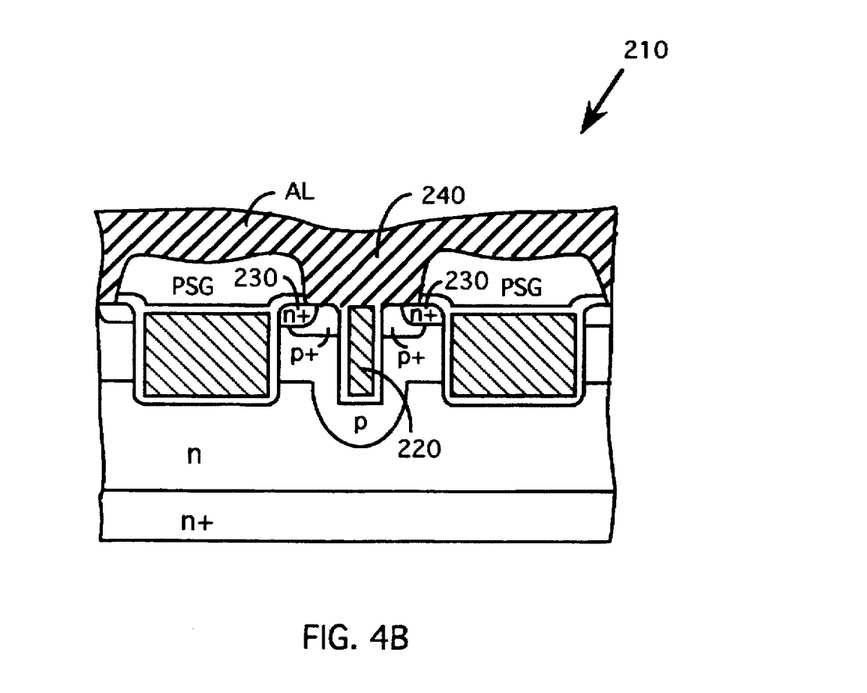
Figure 4C:
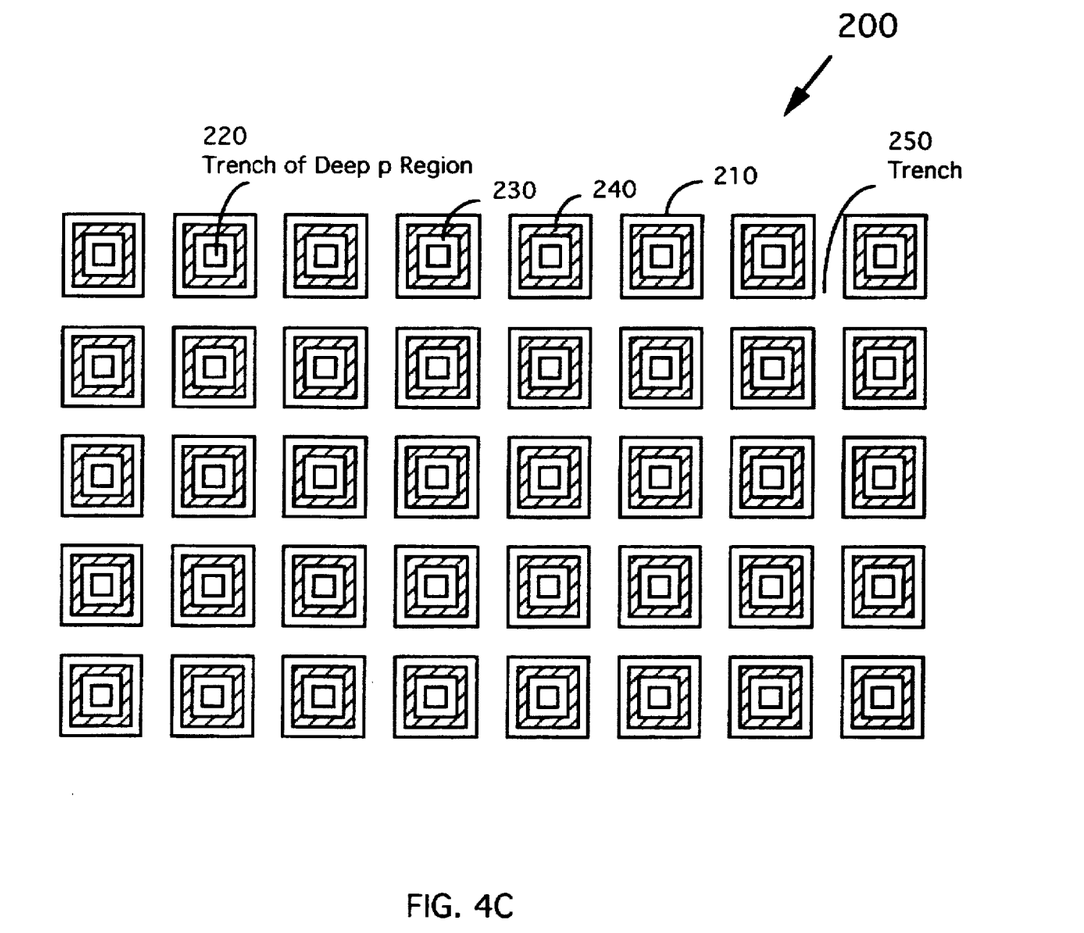
Figure 5:
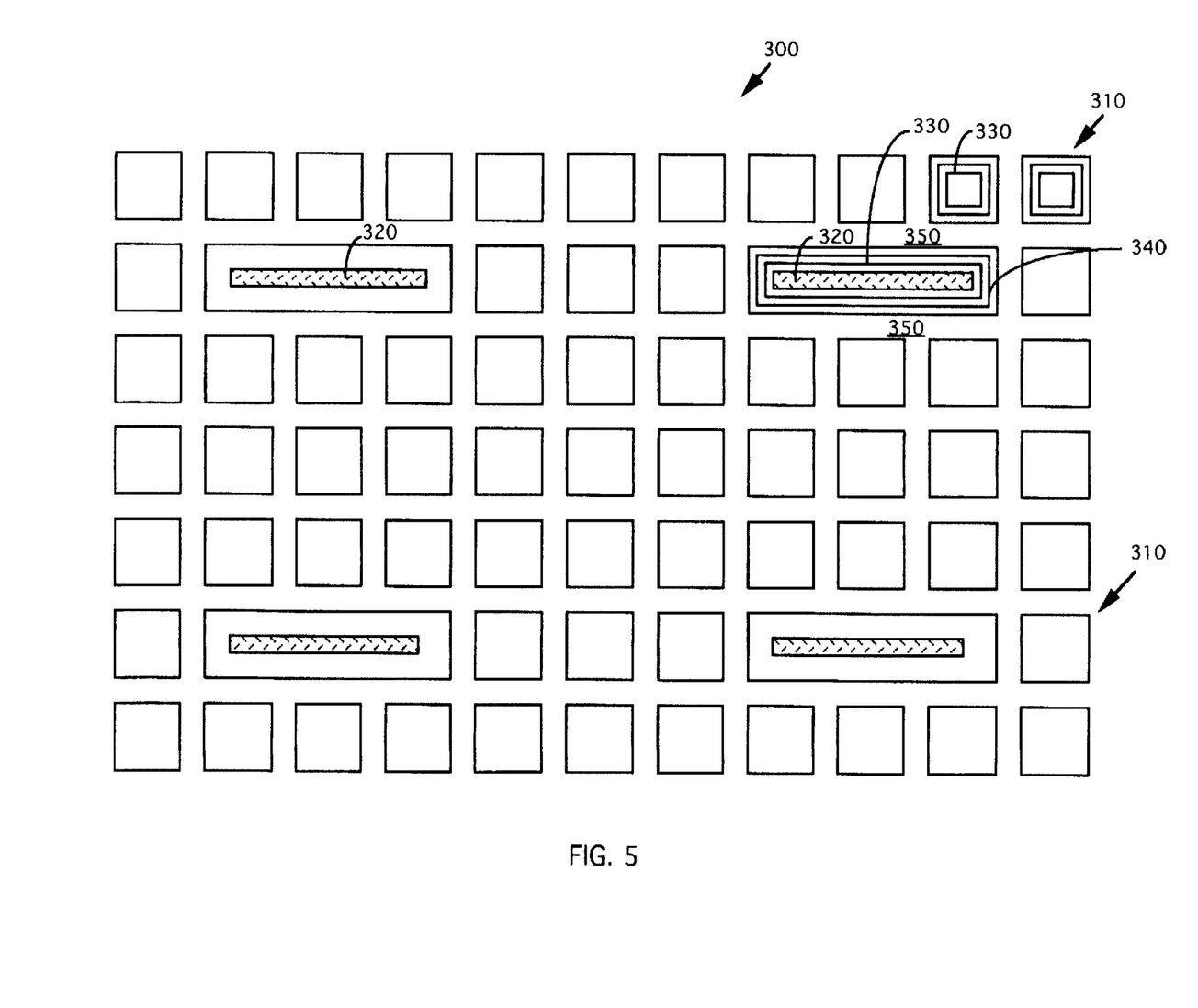
FIG. 5 shows the top view MOSFET transistors of the present invention where the doping trenches are shaped as stripes and disposed in the center of the active cells.

This invention thus introduces a novel MOSFET manufacture process to form the deep-P regions by introducing dopants, e.g., by implanting or diffusion, through the doping-trenches which are opened at areas pre-designated for the deep-P regions. Prior to the doping ions are introduced into the deep-P regions, the doping-trenches, e.g., trenches 112 in FIG. 3, are insulated with oxide, spacer materials on the sidewalls or other dielectric materials. The shapes of the trenches can be in the shape of plugs or stripes so long as they provide a vertical depth to form the deep-P region without requiring long-term diffusion. FIGS. 4A to 4C show a configuration of MOSFET transistors 200 includes many cells 210 where the deep-P regions implanted by applying the doping trenches 220 in the center of the active cells 210. The trenches 220 are then filled with plug materials surrounded by N+ blocking 230 disposed in the middle portion of the source contacts 240. The poly gate areas 250 can be either trenched poly-gates or planar poly gates depending on the performance requirements for the power MOSFET transistors. FIG. 5 is a top view of another preferred embodiment of the present invention which includes a MOSFET device 300 which has many active cells 310 with deep-P regions formed by doping trenches 320 of a stripe shape disposed at the center of active cells 310. Similar to the cells as that shown in FIGS. 4A and 4B, the deep-P regions are surrounded by the N+ blocking regions 330 and source contacts 340. Again the poly gate areas 350 can be formed with either trenched or planar gates depending on the designs and performance requirement of the MOSFET device 300.

Figure 6A:
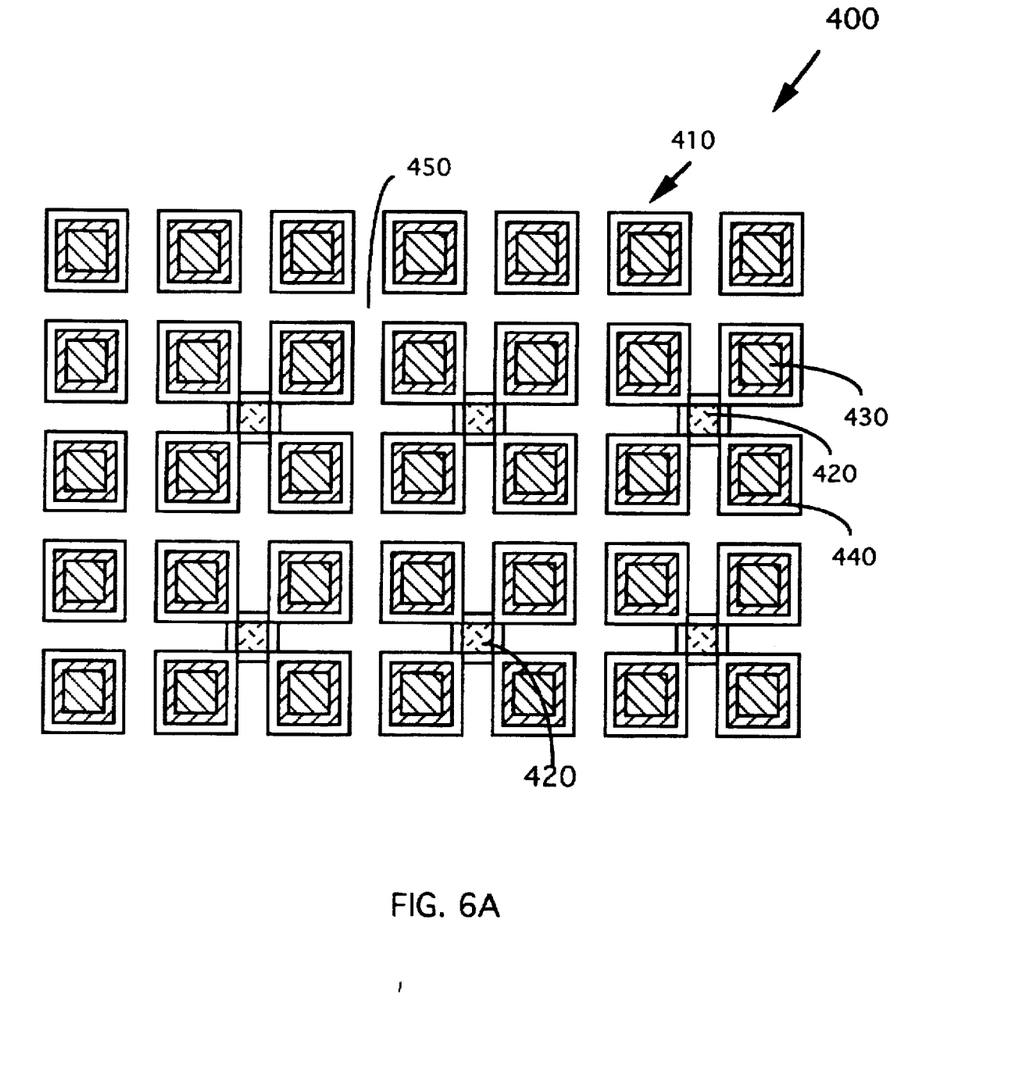
FIGS. 6A and 6B show the top views MOSFET transistors of the present invention where the doping trenches are shaped as plugs and stripes respectively and disposed in the areas of poly gate.
Figure 6B:
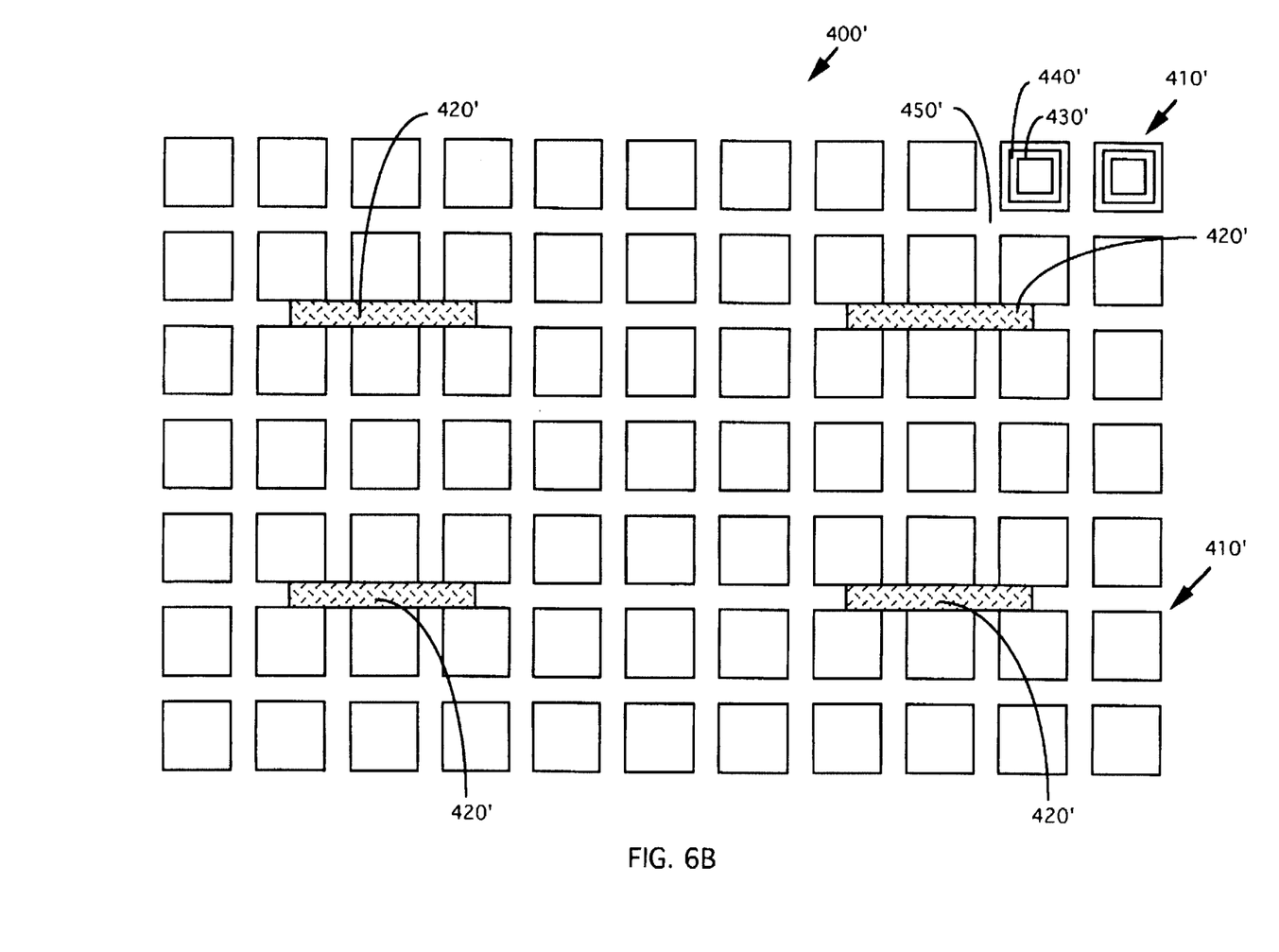
Figure 6C:
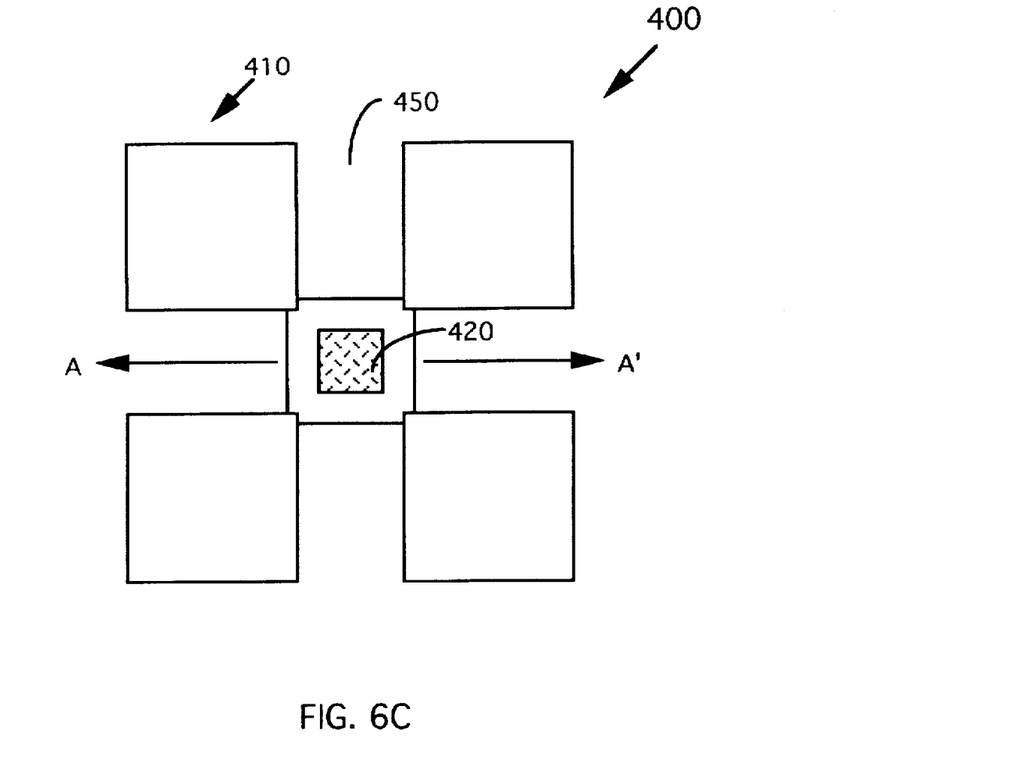
FIGS. 6C and 6D show the top view and cross-sectional views of the MOSFET transistors of FIG. 6A respectively where the doping trenches are shaped as plugs and disposed in the areas of poly gate.
Figure 6D:
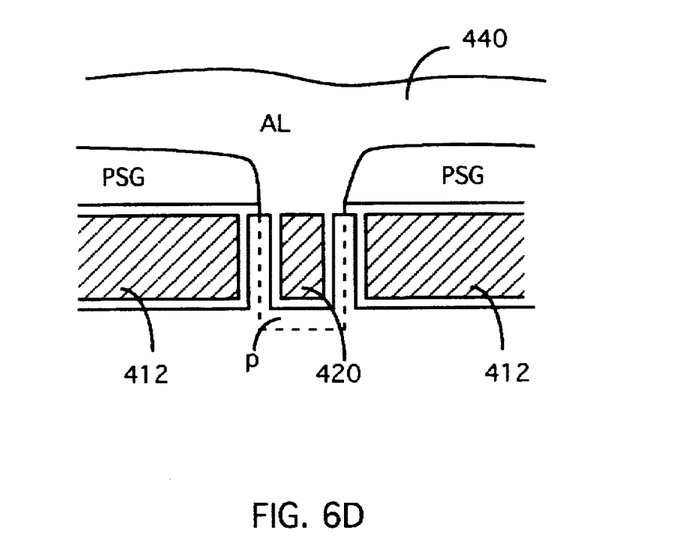

FIG. 6A is a top view of another preferred embodiment of the present invention which includes a MOSFET device 400. The MOSFET 400 has many active cells 410 and each cell includes a N+ source blockings 430 and a source contact 440. The deep-P regions formed by doping trenches 420 which are formed as an doping plugs. The doping trenches 420 are disposed at the areas which are originally designated for poly gate 450. The trenches plugs 420 applied for deep-P region implant are electrically isolated from the poly gates. The trenches plugs 420 can be insulated or electrically shorted to the source contact 440 depending on the process and device design of the MOSFET device 400. FIG. 6B shows a similar MOSFET device 400' where the cells 410' with the N+ blockings 430', the source contacts 440' are identical to that shown in FIG. 6A. The doping trenches 420' are formed in the poly gate areas 450' wherein the doping trenches are formed as stripes 420'. Furthermore, the trenches stripes 420' applied for deep-P region implant are electrically isolated from the poly gates 450'. The trenches stripes 420' can also be insulated or electrically shorted to the source contact 440' depending on the fabrication process and device design of the MOSFET device 400'. In order to more clearly show the MOSFET cell configuration, FIGS. 6C and 6D show the top view and the cross-sectional views respectively of the MOSFET transistors of FIG. 6A. The doping trenches 420 are formed at the poly gate area 410 and is located adjacent to the poly trenches 412. The deep-p region formed by implanting through the doping trench 420 is shown by the dotted line around the doping trench 420. The deep p-doped region provides an advantage that the incidental turning on of the parasitic bipolar transistors is suppressed. Since the deep p-doped region is formed by implanting through the doping trench 420, the deep p-doped region can be formed with greater depth without requiring a large lateral diffusion. Improvement of device ruggedness can be achieved without expanding the width of a MOSFET power transistor cell.

In summary a MOSFET device includes a plurality of vertical cells is disclosed in this invention. Each vertical cell includes a source, a drain, and a channel for conducting source-to-drain current there-through. Each of the vertical cells is surrounded by a poly layer acting as a gate for controlling the source-to-drain current through the channel. The MOSFET device further includes a plurality of doping trenches filled with trench-filling materials. The MOSFET device further includes a plurality of deep-doping regions disposed underneath the doping trenches. In a preferred embodiment, the doping trenches disposed at the center of each of the vertical cells with the deep-doping region disposed underneath a center portion below the vertical cell. In another preferred embodiment, the doping trenches disposed under the poly layer with the deep-doping regions disposed underneath the gates. In yet another preferred embodiment, the doping trenches disposed under the poly layer with each of the trenches extended as an open stripe adjacent to several of the vertical cells.

Figure 7A:
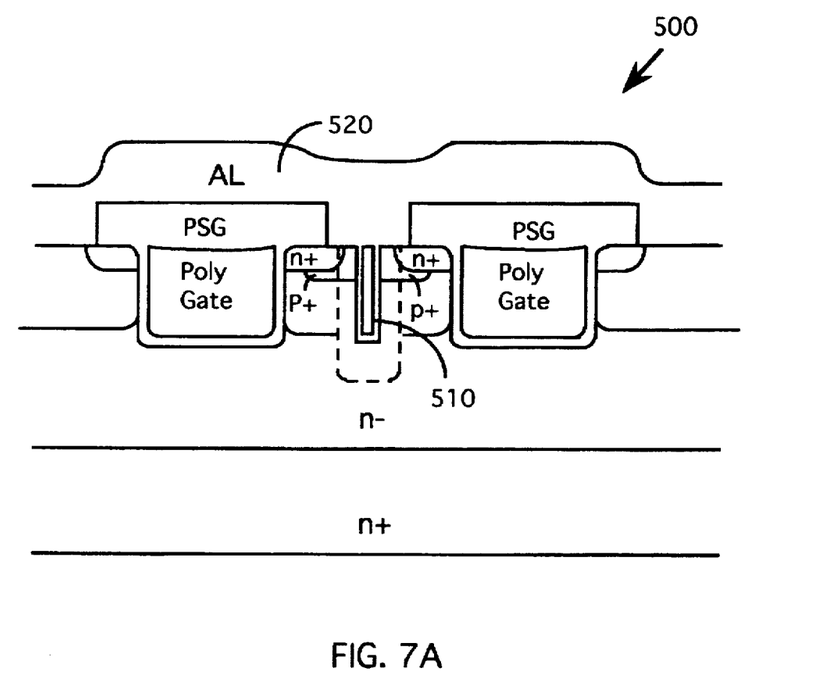
FIGS. 7A and 7B show the cross sectional views of MOSFET devices of the present invention where the doping trenches are formed electrically shorted and insulated from the source contact respectively.
Figure 7B:
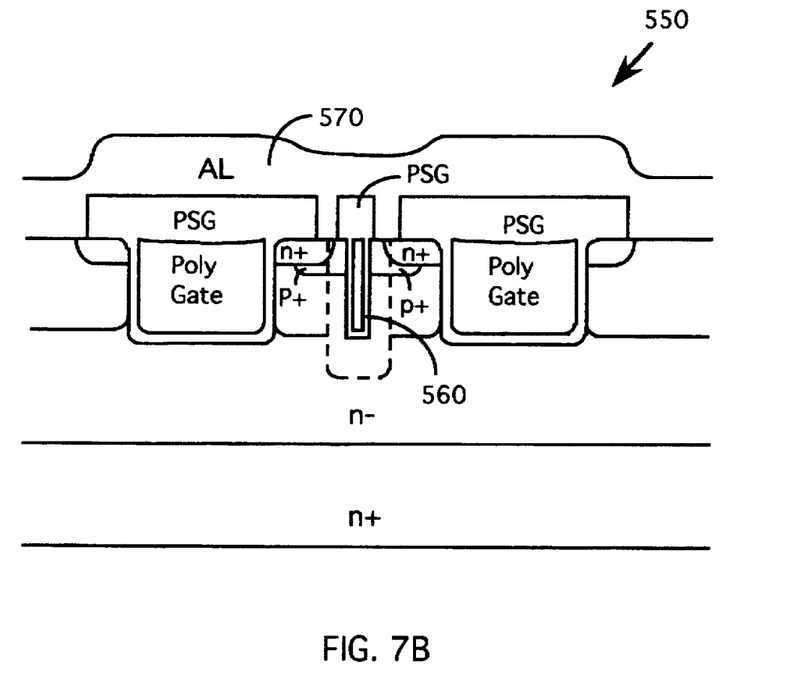

Generally, the doping trenches, e.g., implant or diffusion trenches, are implemented with trenched devices 500 and 550 as that shown in FIGS. 7A and 7B respectively. The polysilicon in the doping trench 510 of device 500 is electrically shorted to the source contact 520 while the polysilicon in the doping trench 560 of device 550 isolated from the source contact 570. The doping trenches formed as plugs, stripes as described above can be filled with oxide, polysilicon, silicon epitaxy, metal or the same material as the gate. The trench filled with one of these materials must be electrically isolated from the gates. Furthermore, the size, depth, shapes, and locations of these doping trenches can be flexibly designed to suit the processing steps and the performance requirements of the device.

Figure 8:
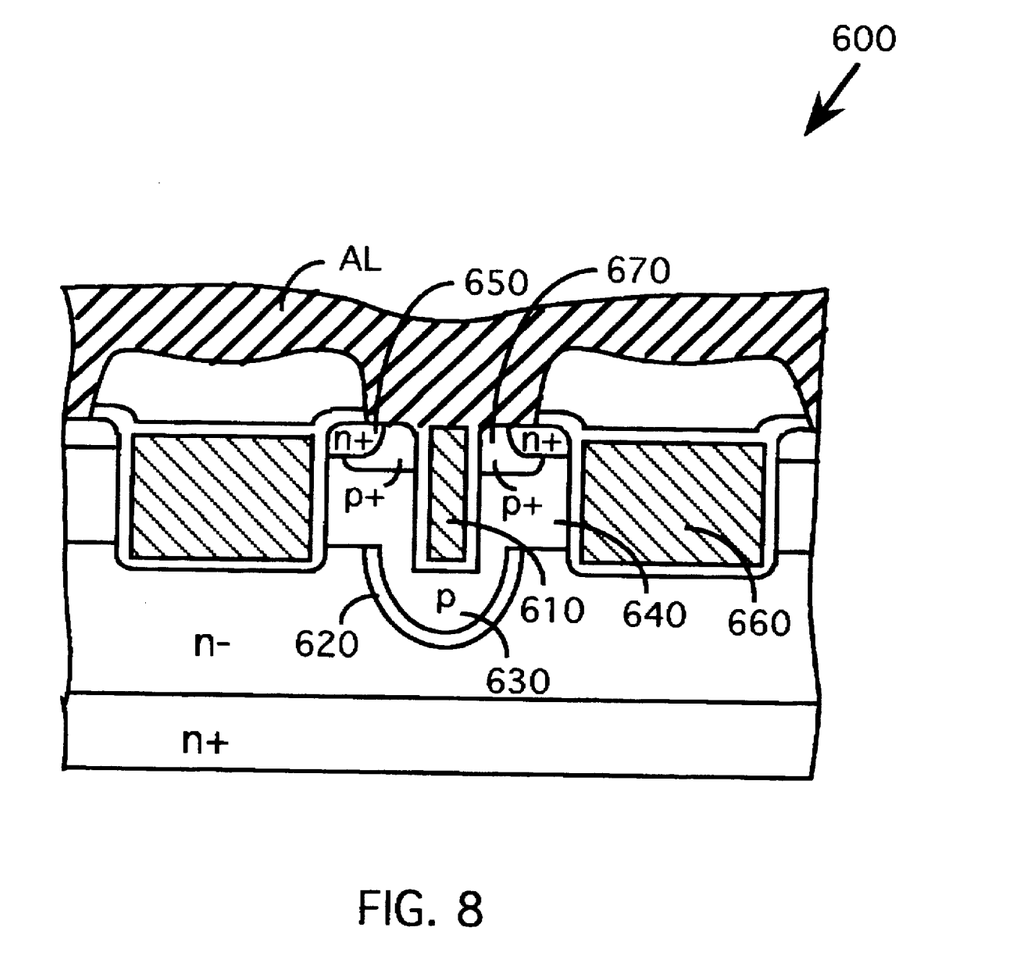
FIG. 8 shows a cross-sectional view of another MOSFET of the present invention where a deep-N and a deep-P doping regions are doped via the doping trench.

FIG. 8 shows another preferred embodiment of the present invention where a MOSFET device 600 includes two deep doping regions. A doping trench 610 is etched to first implant or diffuse a first deep-doping region which is a N− doping region by implanting or diffusing phosphorus or arsenic ions through the doping trench 610. Then a deep-P doping region 630 is formed by introducing the P-ions via the doping trench 610. The P-body regions 640, the source regions 650, the poly gate 660, and the source contact 670 are identical to a regular MOSFET transistor. This double deep-N region 620 and deep-p region 630doping regions provides a PN junction which allows a device designer a means to better control the occurrence and location of breakdown. The deep and narrow doping regions are feasible even with reduced cell size because of the doping trenches which enable the formation of the deep doping regions without requiring prolong diffusion processes causing the undesirable side effects of wide spread lateral-diffusions.

Therefore, the present invention provides a new and improved MOSFET structure and fabrication process to enable those of ordinary skill in the art of MOSFET fabrication to overcome the difficulties and limitations as encountered in the prior art. Specifically, an improved MOSFET structure and fabrication process are disclosed wherein the process of forming a deep-P region for suppressing incidental turning-on of a parasitic bipolar transistor can be accomplished with the deep-P region formed with sufficient depth without proportional lateral diffusion. The cell size can be reduced without being limited by the diffusion length of the deep-P regions. This deep-P region can also be formed with a self-aligned process such that the manufacturability of the MOSFET device may be improved. Furthermore, in this improved MOSFET fabrication process, the implant and diffusion of the deep-P regions are carried out through the doping trenches which are opened at the locations where the deep-P regions are assigned to be located thus the fabrication process can be employed for trenched, planar power MOSFET, IGBT, MCT and other devices and for both N-type and P-type channels. Additionally, by the use of this method, the width, depth, locations and shapes of the deep-P regions and the doping trenches can be flexibly designed and manufactured to achieve various performance requirements.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A MOSFET vertical cell formed in a substrate includes a source, a drain, and a channel for conducting source-to-drain current therethrough across a body region wherein said vertical cell being surrounded by a polysilicon layer acting as a gate for controlling said source-to-drain current through said channel, said MOSFET cell further comprising:
    a doping trench filled with a trench-filling material;
    a deep-doped region disposed underneath said doping trench wherein said deep-doped region extends downwardly to substantially a total depth of an implant depth of said deep-doped region and a vertical diffusion depth below a bottom of said doping trench whereby said deep-doped region defining a buried region disposed below said body region; and
    said doping trench includes an insulation layer insulating said trench filling material from said substrate and said gate, and said doping trench is employed only for implanting dopant ions therethrough and serving no active electrical functions.

2. The MOSFET vertical cell as recited in claim 1 wherein:
    said doping trench disposed substantially at the center of said vertical cell with said deep-doped region disposed thereunder near a center portion of said vertical cell.

3. The MOSFET vertical cell as recited in claim 1 wherein:
    said doping trench being filled with a trench filling material of polysilicon with said deep-doped region disposed thereunder.

4. The MOSFET vertical cell as recited in claim 1 wherein:
    said doping trench filled with said trench filling material with said deep-doped region disposed thereunder is electrically connected to said source.

5. The MOSFET vertical cell as recited in claim 1 wherein:
    said doping trench filled with said trench filling material with said deep-doped region disposed thereunder is electrically insulated from said source.

6. The MOSFET vertical cell as recited in claim 1 further comprising:
    a lower deep-doped region disposed lower than said deep-doped region wherein said lower deep doped region is doped with impurities of a different conductivity type than a conductivity type of said deep-doped region.

7. A MOSFET device formed in a substrate includes a plurality of vertical cells each includes a source, a drain, and a channel for conducting source-to-drain current therethrough across a body region wherein each of said vertical cells being surrounded by a polysilicon layer acting as a gate for controlling said source-to-drain current through said channel, said MOSFET device further comprising:
    a plurality of doping trenches filled with a trench-filling material;
    a plurality of deep-doped regions disposed underneath said doping trenches wherein each of said deep-doped regions extends downwardly to substantially a total depth of an implant depth of said deep-doped region and a vertical diffusion depth below a bottom of a corresponding doping trench whereby each of said deep-doped regions defining a buried region disposed below said body region; and
    each of said doping trenches included an insulation layer insulating said trench filling material from said substrate and said doping trench is employed only for implanting dopant ions there through and serving no active electrical function.

8. The MOSFET device as recited in claim 7 wherein:
    each of said doping trenches disposed substantially at the center of one of said vertical cells with said deep-doped region disposed thereunder near a center portion of said vertical cell.

9. The MOSFET device as recited in claim 7 wherein:
    each of said doping trenches being filled with a trench filling material of polysilicon with one of said deep-doped regions disposed thereunder.

10. The MOSFET device as recited in claim 9 wherein:
    each of said doping trenches disposed substantially at the center of one of said vertical transistor cells.

11. A vertical power transistor cell formed in a substrate includes a source, a drain, and a channel for conducting source-to-drain current therethrough across a body region wherein said vertical cell being surrounded by a polysilicon layer acting as a gate for controlling said source-to-drain current through said channel, said power transistor cell further comprising:
    a doping trench filled with a trench-filling material wherein said doping trench includes an insulation layer insulating said trench filling material from said substrate and said gate, and said doping trench is employed only for implanting dopant ions therethrough and serving no active electrical functions;
    a deep-doped region disposed underneath said doping trench wherein said deep-doped region extends downwardly to substantially a total depth of an implant depth of said deep-doped region and a vertical diffusion depth below a bottom of said doping trench whereby said deep-doped region defining a buried region disposed below said body region; and
    a lower deep-doped region disposed lower than said deep-doped region wherein said lower deep doped region is doped with impurities of a different conductivity type than a conductivity type of said deep-doped region.

* * * * *